(12) United States Patent
Branscome et al.

(10) Patent No.: US 7,606,968 B2
(45) Date of Patent: Oct. 20, 2009

(54) MULTI-LEVEL CONTENT ADDRESSABLE MEMORY

(75) Inventors: Jeremy Branscome, Santa Clara, CA (US); Michael Corwin, Sunnyvale, CA (US)

(73) Assignee: McData Corporation, Broomfield, CO (US)

( * ) Notice: Subject to any disclaimer, the term of this patent is extended or adjusted under 35 U.S.C. 154(b) by 399 days.

(21) Appl. No.: 11/430,389

(22) Filed: May 8, 2006

(65) Prior Publication Data
US 2007/0260814 A1 Nov. 8, 2007

(51) Int. Cl.
G06F 12/00 (2006.01)
(52) U.S. Cl. ........................... 711/108; 711/117
(58) Field of Classification Search .............. 711/108, 711/117
See application file for complete search history.

(56) References Cited

U.S. PATENT DOCUMENTS

| | | | |
|---|---|---|---|
| 6,763,426 B1 * | 7/2004 | James et al. | 711/108 |
| 7,088,735 B1 | 8/2006 | Reohr | |
| 7,188,211 B2 * | 3/2007 | Roth et al. | 711/108 |
| 7,193,997 B2 * | 3/2007 | Van Lunteren et al. | 370/392 |
| 7,366,165 B2 * | 4/2008 | Kawarai et al. | 370/366 |

OTHER PUBLICATIONS

Schluting, C., "On Your Network: What the Heck is a TCAM?" http://www.enterprisenetworkingplanet.com/nethub/article.php/3527301, Aug. 12, 2005, (downloaded Oct. 5, 2005).
"How To Get Dynamic CAM Entries (CAM Table) for Catalyst Switches Using SNMP," http://www.cisco.com/warp/public/477/SNMP/cam_snmp.shtml, Cisco Systems Inc., 2003, (downloaded Oct. 5, 2005).
Pagiamtzis, K., "Content-Addressable Memory (CAM) Primer," http://www.eecg.toronto.edu/~pagiamt/cam/camintro.html, 2005, (downloaded Oct. 5, 2005).
Liu, H., "Efficient Mapping of Range Classifier into Ternary-CAM," Stanford University, Aug. 28, 2002.

* cited by examiner

*Primary Examiner*—Matt Kim
*Assistant Examiner*—John P Fishburn
(74) *Attorney, Agent, or Firm*—Hensley Kim & Holzer, LLC

(57) ABSTRACT

A multi-level content addressable memory (CAM) architecture compresses out much of the redundancy encountered in the search space of a single CAM, particularly for flow-based lookups in a network. Destination and source address may be associated with internal equivalence classes independently in one level of the multi-level CAM architecture, while flow-specific properties linking arbitrary classes of the destination and source addresses may be applied in a later level of the multi-level CAM.

20 Claims, 10 Drawing Sheets

MULTI-LEVEL CONTENT ADDRESSABLE MEMORY

TECHNICAL FIELD

The invention relates generally to a content addressable memory (CAM), and more particularly to a multi-level CAM.

BACKGROUND

A storage area network (SAN) may be implemented as a high-speed, special purpose network that interconnects different kinds of data storage devices with associated data servers on behalf of a large network of users. Typically, a SAN is part of the overall network of computing resources for an enterprise. SAN switch products are an integral part of the network providing switching/routing functionality to connect the disparate devices on the network such that data frames sent between the devices travel an efficient route across the network.

SAN switches generally receive data frames at ports of the switch (referred to as source or ingress ports for a given port-to-port path) and forward the data frames to appropriate other ports of the switch (referred to as destination or egress ports for a given port-to-port path) to assist in routing the data frame from a source device in the SAN (e.g., a storage device designated by a source identifier or SID) to a destination device in the SAN (e.g., a server designated by a destination identifier or DID). In some implementations, a CAM is used to forward such data frames from individual source ports in a switch to appropriate destination ports in the switch. In one view, therefore, the CAM provides the functionality of a forwarding database. For example, the switch can extract a DID from the header of a received data frame and use the DID to "look up" (in the CAM) the appropriate destination port through which to transmit the data frame.

However, CAM devices are expensive, particularly as they increase in capacity, and therefore a traditional CAM structure does not economically scale to handle the growing size and complexity of modern and future SANs. For example, previous SANs have required that a CAM map thousands of addresses in a 24-bit address space, whereas current and future SAN architectures will map millions of address combinations (e.g., source and destination addresses, etc.) in a 48-bit address space, at a minimum, to accommodate modem routing, zoning, and load balancing requirements. Therefore, as SAN architectures continue to scale upwards in size and complexity, addressing requirements are expected to exceed the capacity of a single affordable CAM device.

SUMMARY

Implementations described and claimed herein address the foregoing problems by providing a multi-level CAM architecture that compresses out much of the redundancy encountered in the search space of a single CAM, particularly for flow-based lookups. For example, destination and source address may be associated with internal equivalence classes independently in one level of the multi-level CAM architecture, while flow-specific properties linking arbitrary classes of the destination and source addresses may be applied in a later level of the multi-level CAM.

BRIEF DESCRIPTIONS OF THE DRAWINGS

Figure 3:
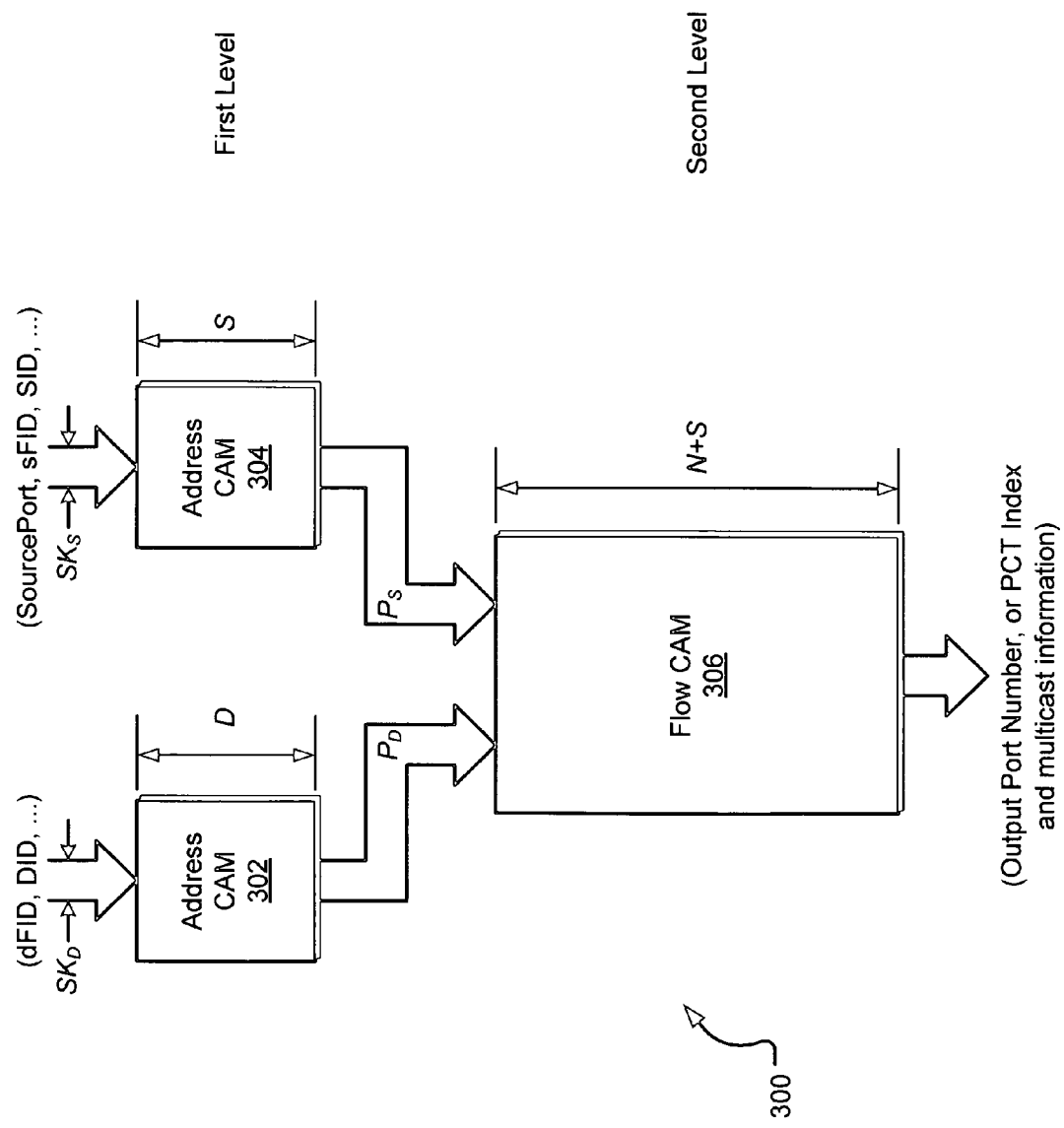

FIG. 3 schematically illustrates an exemplary multi-level CAM.

Figure 4:
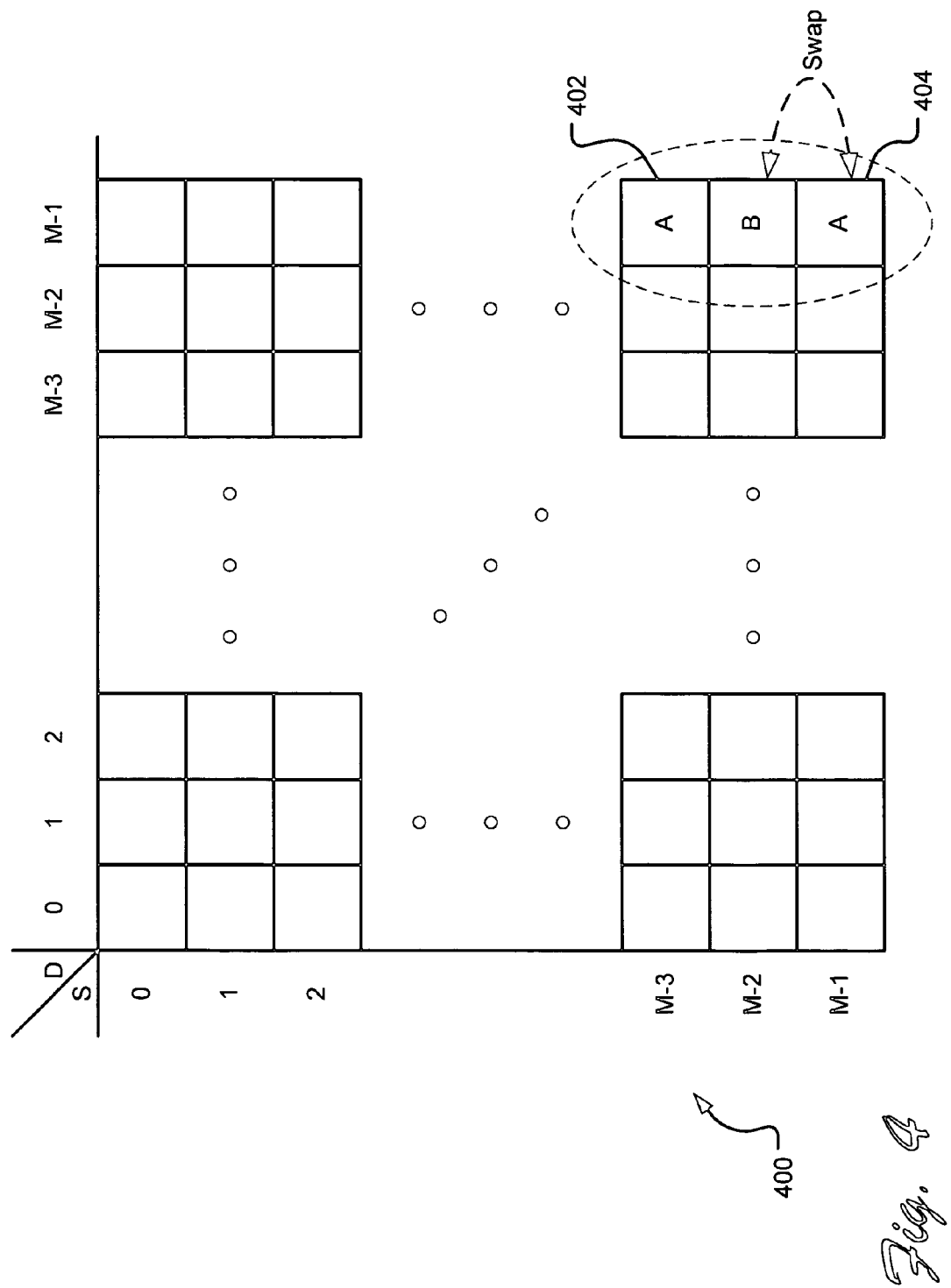

FIG. 4 illustrates an exemplary flow zoning matrix.

Figure 5:
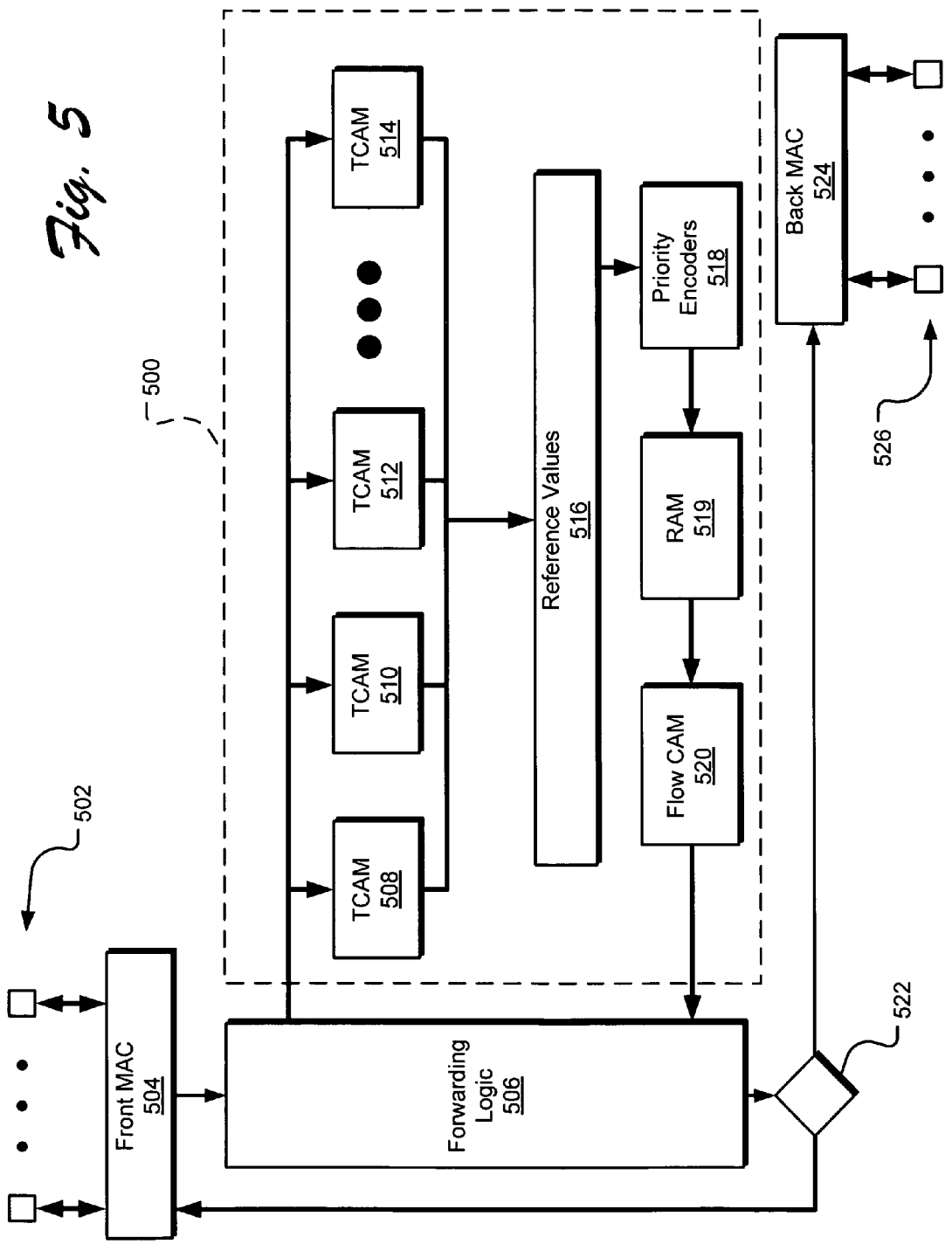

FIG. 5 illustrates an exemplary configuration of a switch having a multi-level CAM.

Figure 6:
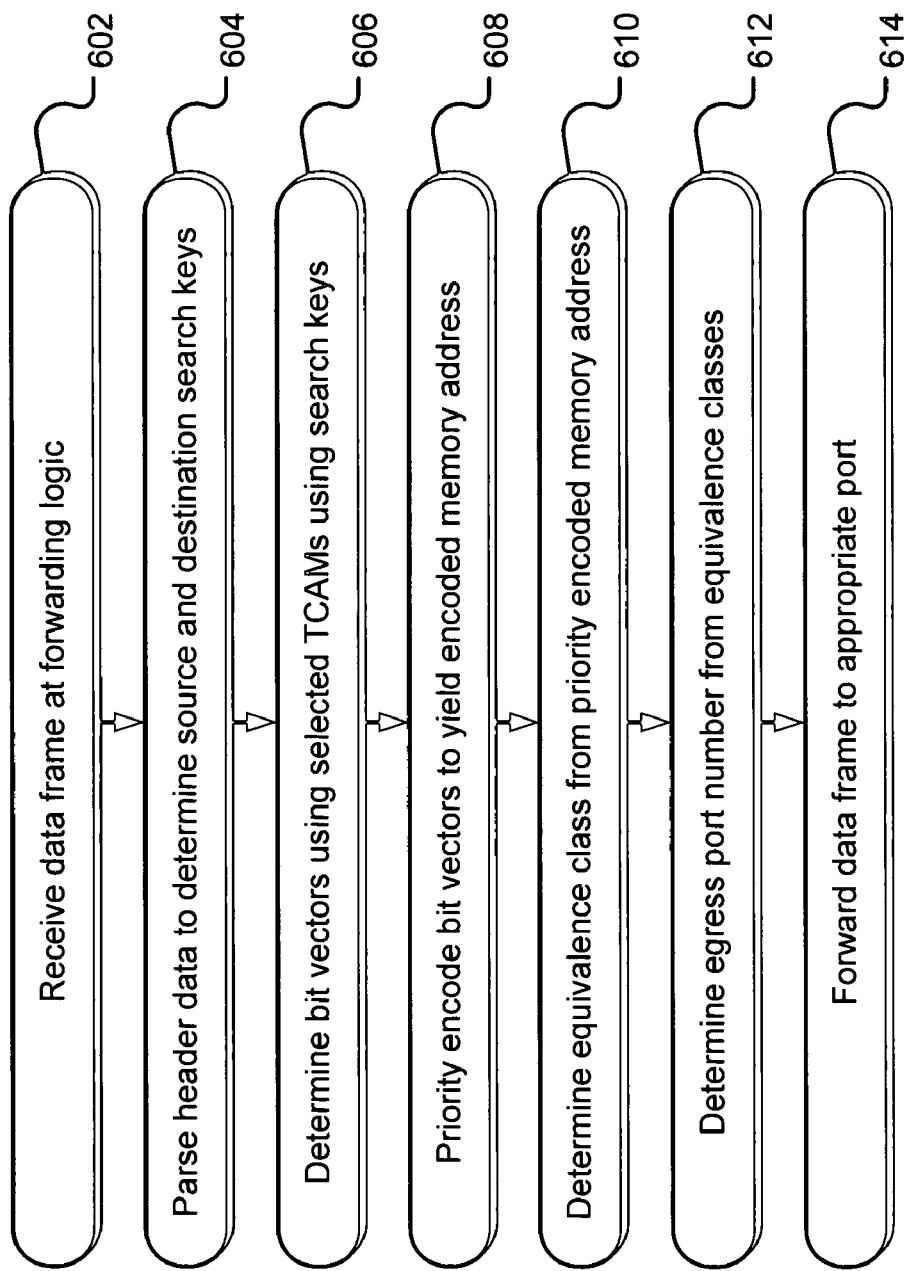

FIG. 6 illustrates exemplary operations for processing a data frame using a multi-level CAM.

Figure 7:
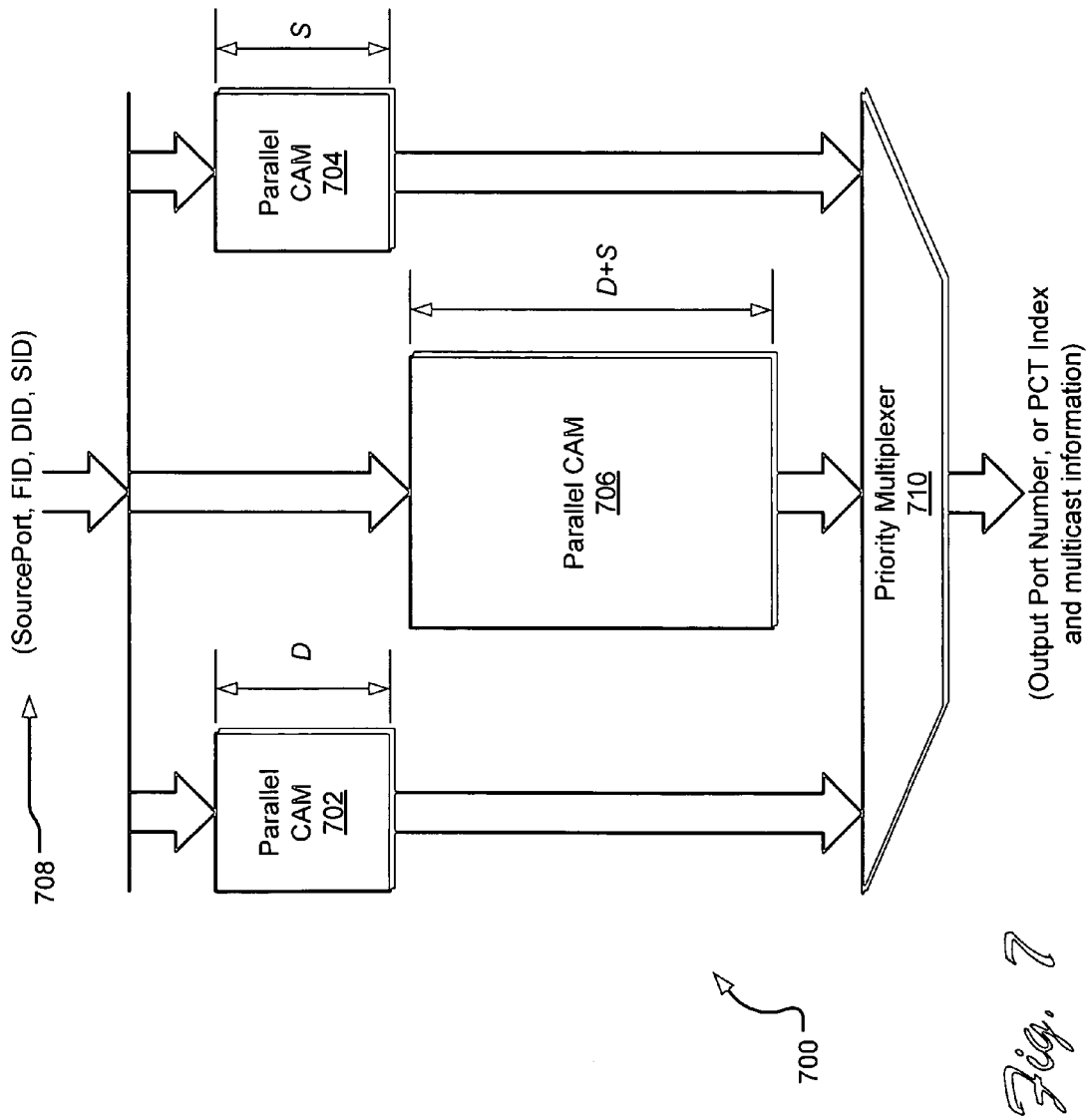

FIG. 7 illustrates an alternative implementation of an exemplary multi-level CAM.

Figure 8:
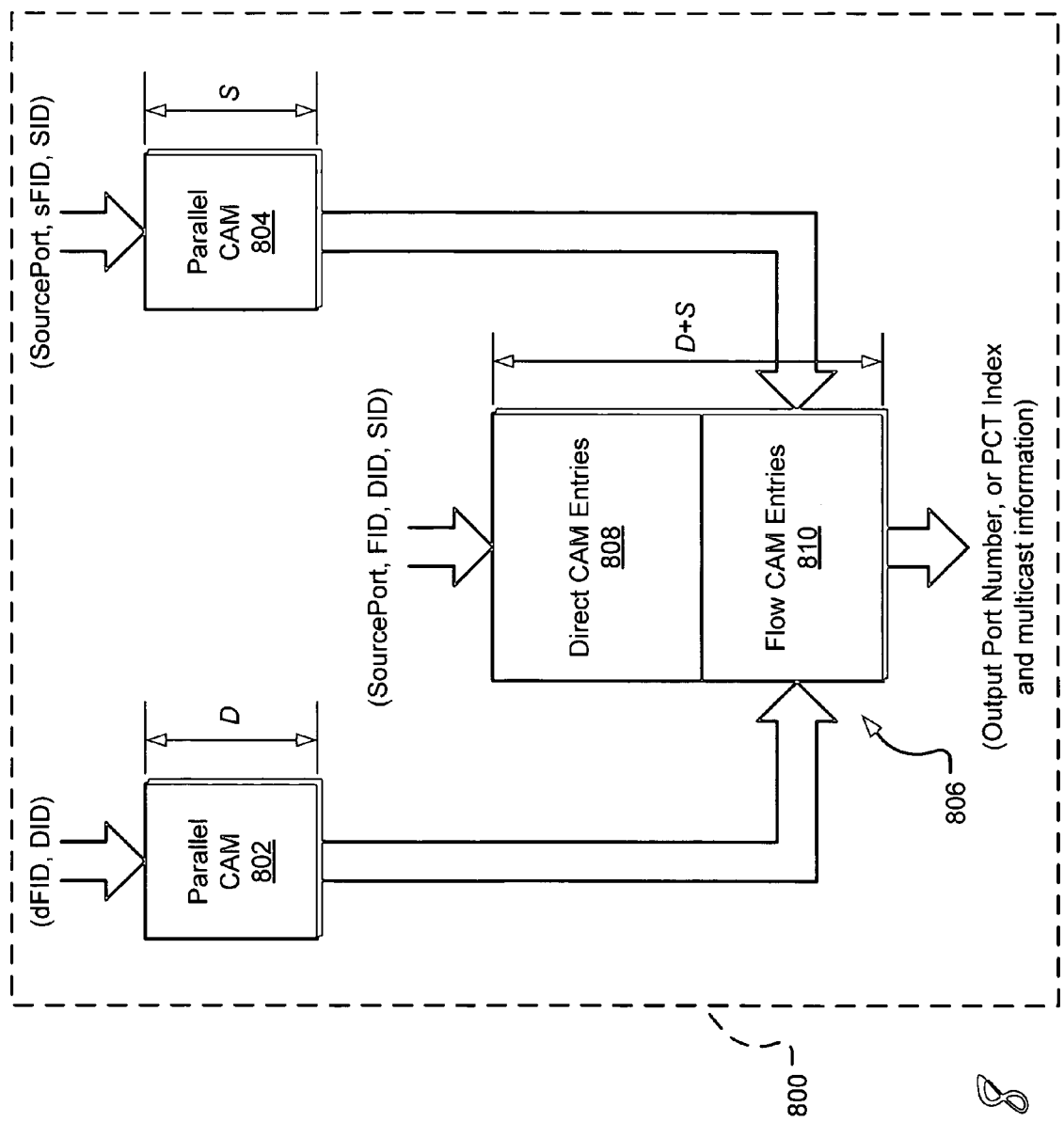

FIG. 8 illustrates another alternative implementation of an exemplary multi-level CAM.

Figure 9:
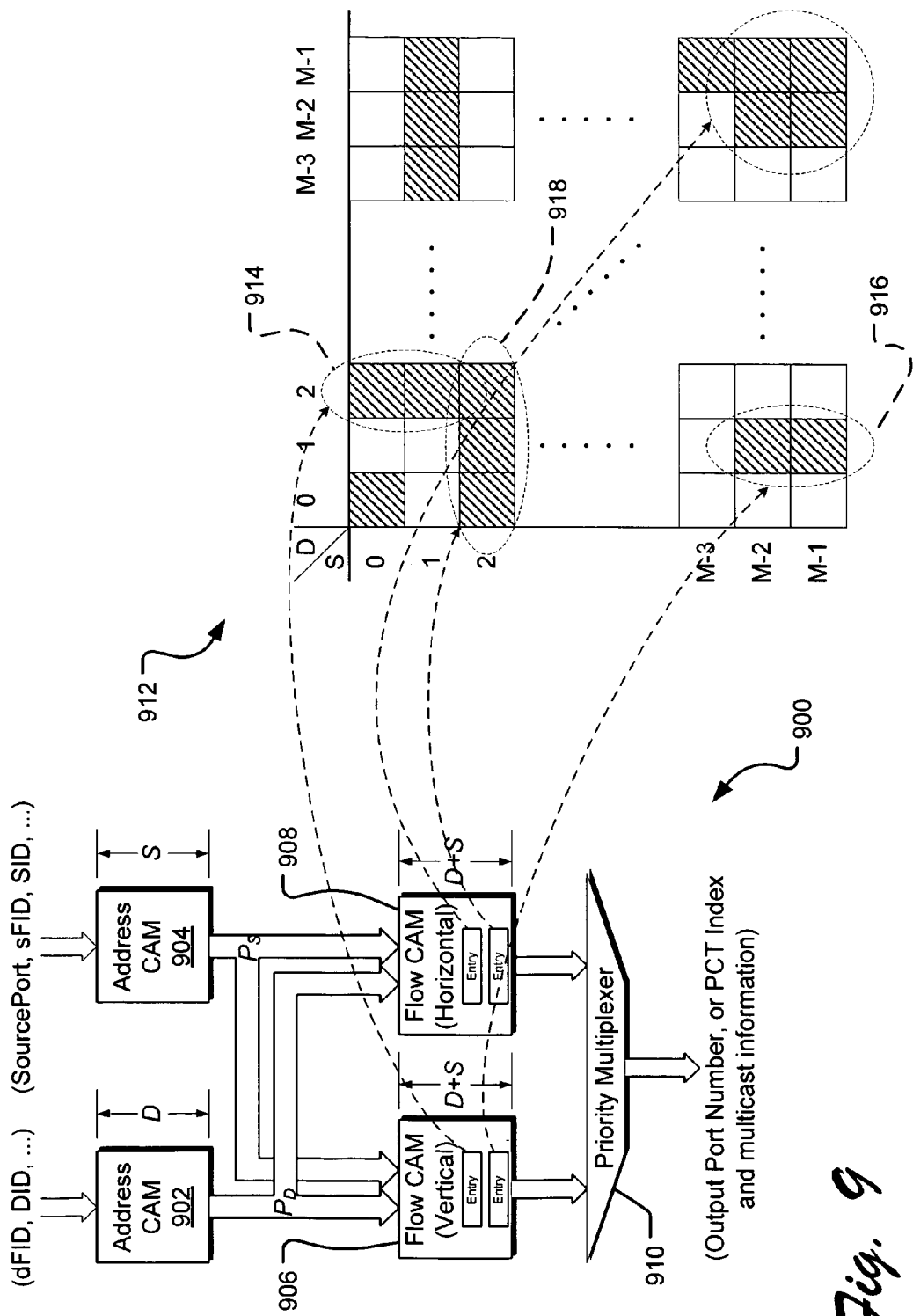

FIG. 9 illustrates yet another alternative implementation of an exemplary multi-level CAM.

Figure 10:
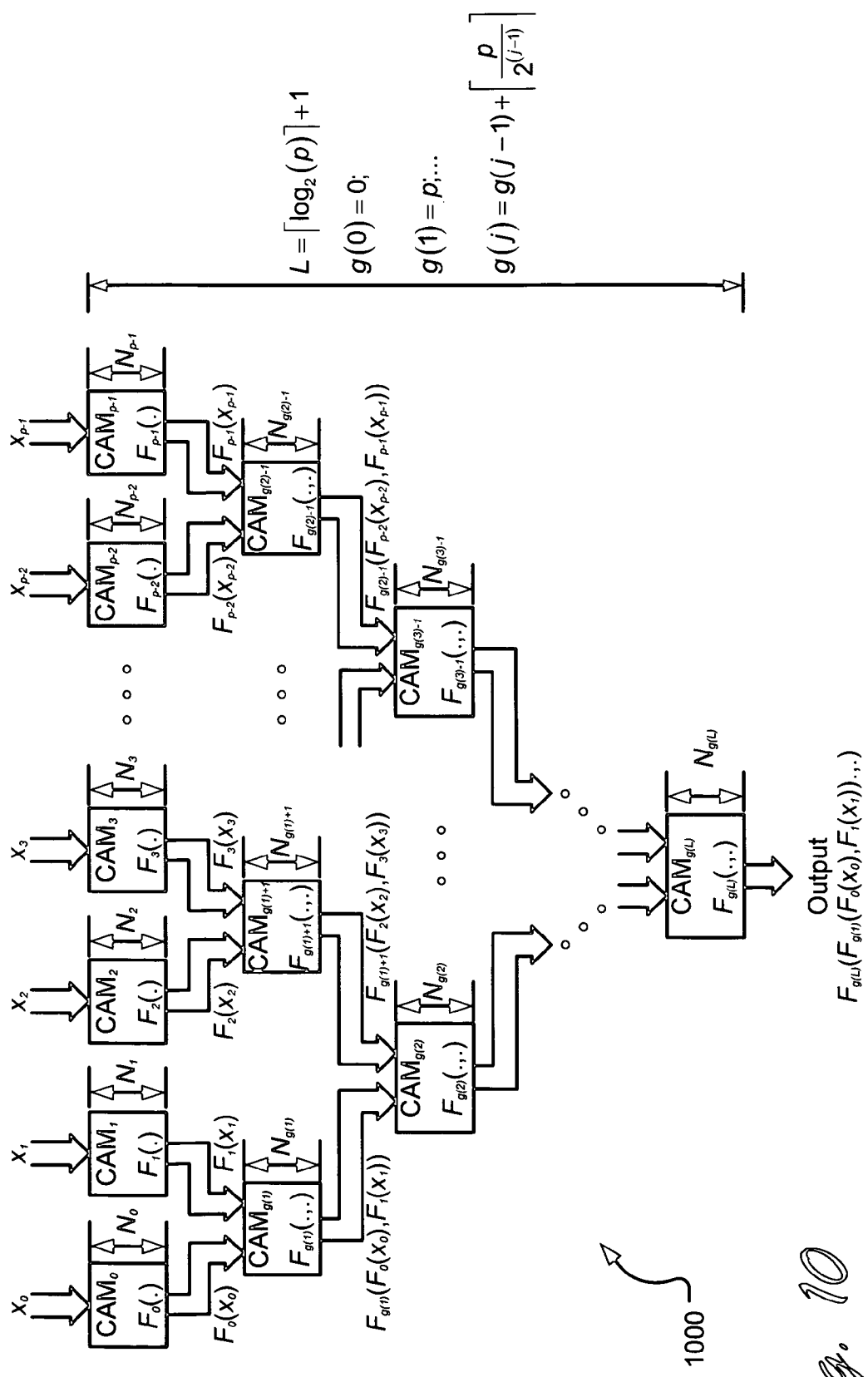

FIG. 10 illustrates yet another alternative implementation of an exemplary multi-level CAM.

DETAILED DESCRIPTIONS

Figure 1:
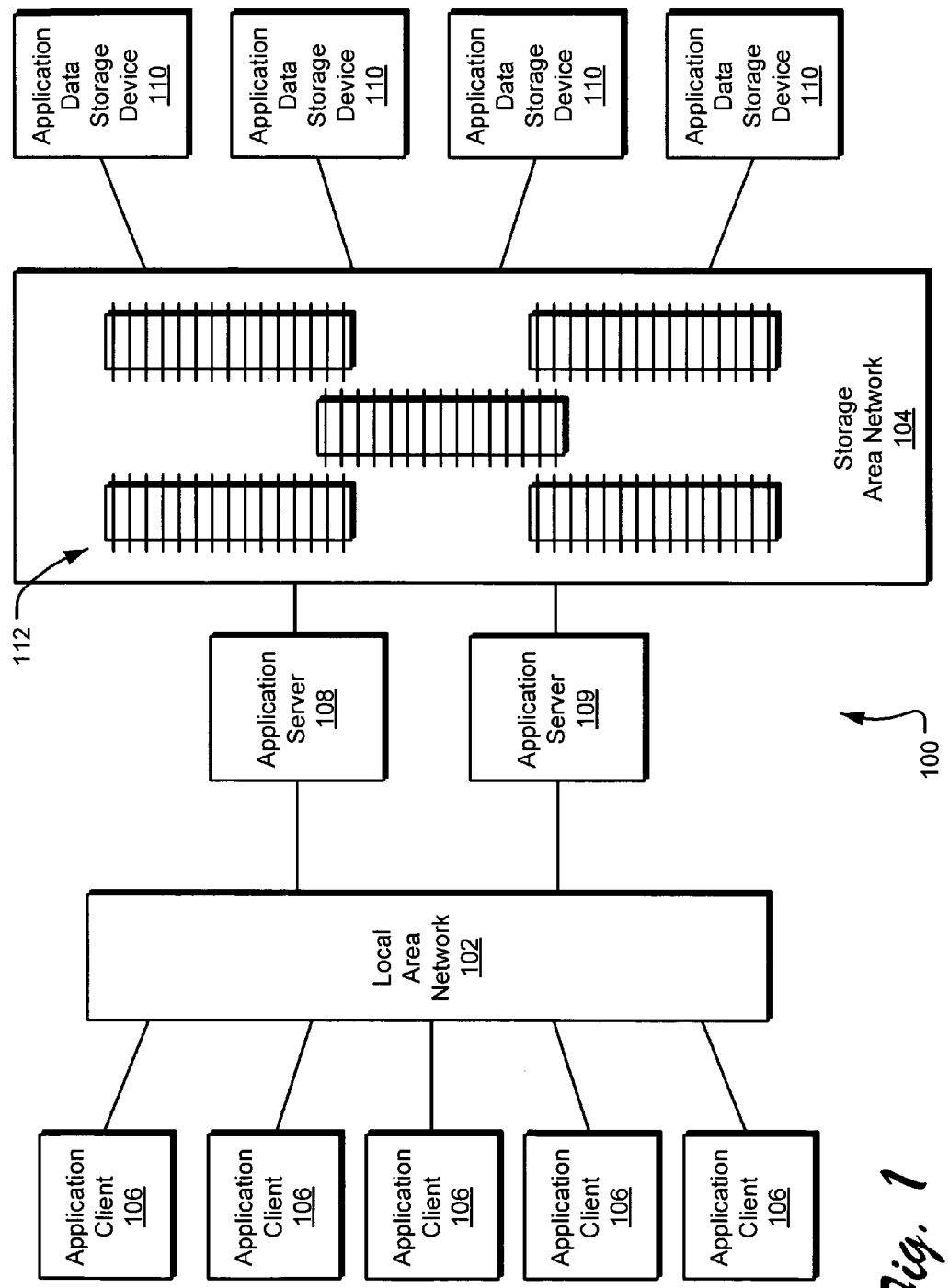
FIG. 1 illustrates an exemplary computing and storage framework including a local area network (LAN) and a storage area network (SAN).

FIG. 1 illustrates an exemplary computing and storage framework 100 including a local area network (LAN) 102 and a storage area network (SAN) 104. Various application clients 106 are networked to application servers 108 and 109 via the LAN 102. Users can access applications resident on the application servers 108 and 109 through the application clients 106. The applications may depend on data (e.g., an email database) stored at one or more of the application data storage devices 110. Accordingly, the SAN 104 provides connectivity between the application servers 108 and 109 and the application data storage devices 110 to allow the applications to access the data they need to operate. It should be understood that a wide area network (WAN) may also be included on either side of the application servers 108 and 109 (i.e., either combined with the LAN 102 or combined with the SAN 104).

Within the SAN 104, one or more switches 112 provide connectivity, routing and other SAN functionality. Switches are examples of network communications devices. Other examples may include routers, firewalls, gateways, servers, modems, and other such devices. Some such switches 112 may be configured as a set of blade components inserted into a chassis or as rackable or stackable modules. The chassis has a back plane or mid-plane into which the various blade components, such as switching blades and control processor blades, may be inserted. Rackable or stackable modules may be interconnected using discrete connections, such as individual or bundled cabling.

CAMs can associate a relatively small set K of arbitrarily sparse vectors originating from a very large vector space V. The vector space V is sufficiently large to preclude storage associating all of its elements, and the vector set K is sufficiently small relative to V that such a total mapping would be very wasteful. In a networking environment, a switch that performs only destination-based routing would typically use a CAM to associate a small, sparse set K of node port identifiers (NPIDs) or addresses, such as SIDs and/or DIDs, from the total address space V with specific properties, such as output port numbers, routing information, etc. In one implementation of a switch, the CAM can be used to forward a data frame addressing any element of the address set K to a correct destination port in the switch, for example. In this manner, a CAM can be used as a searchable forwarding database for a switching device in Fibre Channel and other networking environments, although other applications are also contemplated.

Further, a multi-level CAM architecture can be used to economically increase the supportable size of the total address space V. For example, whereas a 24-bit address space has been used in Fibre Channel switches, it is anticipated that future switches will support larger address spaces, such as 48-bit address spaces and larger. Furthermore, enhanced functionality relating to traffic flows dramatically increase the total address space by introducing combinations of source addresses and destination addresses, for example. In the illustration of FIG. 1, one or more of the switches 112 within the SAN 104 include a multi-level CAM device for implement a forwarding database. In this manner, such switches can support an expanded search space over previous approaches and can provide enhanced functionality such as hard zoning, N_Port ID Virtualization (NPIV), load balancing, support for extremely large fabrics, etc.

Generally, a "flow" represents a transmission from a source device to a destination device. From another perspective, a flow represents a set of one or more transmissions from a set of one or more source devices to a set of one or more destination devices, where intermediate data transport devices (e.g., switches and routers) may, at their discretion, define and further combine (superclass) or divide (subclass) any flow based upon temporal, spatial, and/or embedded data characteristics in herein to each constituent data unit, such as a frame or packet. It should be understood that this latter perspective is merely exemplary.

CAMs may be implemented as conventional semiconductor memory (e.g., SRAM) with added comparison circuitry that enables a search operation to complete quickly (e.g., a single clock cycle). There are two basic forms of CAM: binary and ternary (although other forms may be employed). A binary CAM supports storage and searching of binary bits: (0, 1). A ternary CAM (i.e., a "TCAM") supports storage and searching of three bits: (0, 1, X), where X represents a wildcard or "don't care" bit that can match any bit value of a search key. In one implementation, CAM core cells contain both storage and comparison circuitry and are arranged into an array of horizontal words the width of a search key. Search words are stored in the horizontal words of the array. Search lines run vertically through the array and broadcast the search key to the CAM core cells. Matchlines run horizontally across the array and indicate whether the search key matches the horizontal search word in each row. An activated matchline indicates a match of the corresponding search word and a deactivated matchline indicates a non-match or mismatch. The matchlines are input to an encoder that generates the address corresponding to the match location. Other CAM implementations are also contemplated, including RAM-based binary search trees.

Figure 2:
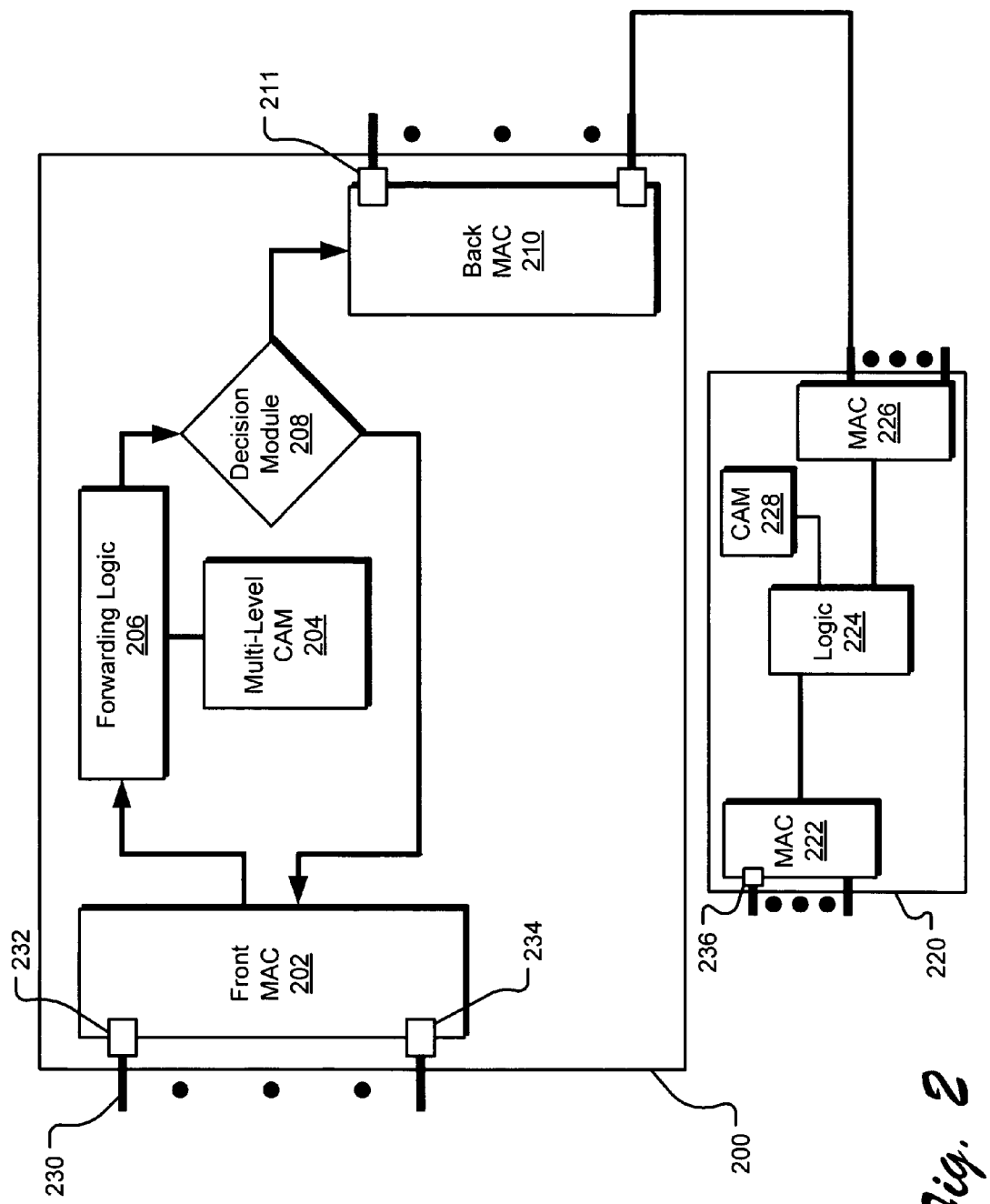
FIG. 2 illustrates an exemplary port module within a switch.

FIG. 2 illustrates an exemplary port module 200 within a switch. The port module 200 includes a front media access controller (MAC) 202 that interfaces the port module 200 to network connections, such as a Fibre Channel link 230. The illustrated port module 200 also includes a back MAC 210 that interfaces the port module to interconnections that can be coupled to other switch components, such as another port module 220 or a switch module (not shown). In one implementation, cabling between the port modules 200 and 220 interconnects extender ports (see e.g., extender port 211) of each device to allow intra-switch communications between the port modules 200 and 220 of the switch, although other intra-switch communication schemes are contemplated.

In operation, for example, the port module 200 may receive a data frame through a port 232 on the front MAC 202. Generically, a data frame represents a set of data communicated between entities in a network, such as a data frame in Fibre Channel vernacular or a data packet in Ethernet vernacular. The front MAC 202 passes the data frame to forwarding logic module 206, which extracts data elements from the frame's header information (or other information) to search the multi-level CAM 204. The data elements used to search the CAM, such as DIDs and SIDs, may be used to form one or more "search keys". Assuming the one or more search keys satisfies one or more appropriate entries in the CAM 204, the forwarding logic module 206 extracts the associated destination port number associated with the satisfied entries from the CAM 204 and then outputs the destination port number and the received data frame to a decision module 208.

The decision module 208 determines whether the identified destination port exists in the port module 200 or on another port module, such as port module 220. If the destination port exists in the port module 200, the decision module 208 directs the data frame to the appropriate port (e.g., port 234) in the port module 200. In contrast, if the destination port exists outside the port module 200, the decision module 208 determines which extender port on the back MAC 210 is coupled to the port module 200 that includes the identified destination port and directs the data frame to that extender port. The extender port then communicates the data frame to a back MAC 226 of the port module 220. It should be understood that the back MAC 226 may also communicate with the forwarding logic module 206 to forward incoming data frames (transmitted from another port module) from the back MAC 226 to the appropriate destination front port of the port module 200. For completeness, the logic 224 of the port module 220 may construct one or more search keys from the received data frame, use a multi-level CAM 228 to determine the appropriate destination port number from the CAM 228, and forward the data frame to the identified destination port 236 of the front MAC 222 for communication via a network connection.

It should also be understood that a CAM may be used for other purposes within a switching device. For example, in the case of hard zoning, an SID may be extracted from the data frame header and used as a search key to identify a valid DID within a zone. Alternatively, in the case of load balancing, an SID may be extracted from the data frame header and used as a search key (whether or not associated with a specific port or pair of ports on the switch) to identify an appropriate DID to handle the communication. Moreover, a multi-level CAM may be used in non-networking applications, including processor caches, translation look-aside buffers (TLB), data compression applications, database accelerators, and neural networks.

FIG. 3 schematically illustrates an exemplary multi-level CAM 300, including two address CAM modules 302 and 304 and a flow CAM module 306. The exemplary CAM 300 is configured for flow-specific switching/routing (e.g., distinguishing both destination and source addresses). The destination address CAM module 302 receives a destination search key consisting of data frame header fields relating to the destination address, such as the data frame's virtual fabric identifier (e.g., VF_ID or dFID), DID, and/or other properties, such as specific sequence numbers, exchanged identifiers, SOF (start of frame) values, etc. The source address CAM module 304 receives a source search key consisting of data frame header fields relating to the source address, such as the data frame's virtual fabric identifier (e.g., VF_ID or sFID), SID, and/or other properties, such as specific sequence numbers, exchanged identifiers, SOF values, etc. Individual header fields as well as other data may be mixed and matched to form a search key for a specific type of look-up. The use of separate source and destination address CAM modules allows different aspects of the packet flow to be looked-up separately in one level of the multi-level CAM, thereby reducing the number of total CAM entries.

In the illustrated implementation, the destination address CAM module 302 has a width equal to the length of a destination search key $SK_D$ and a depth equal to D, where D is dependent on the total number of destination devices that can be addressed through the multi-level CAM 300, although other definitions of D may be employed (e.g., in one implementation, D represents half of the total number of destination devices that can be addressed through the multi-level CAM). In the illustrated implementation, the source address CAM module 304 has a width equal to the length of a source search key $SK_S$ and a depth equal to S, where S is dependent on the total number of source devices that can be addressed through the multi-level CAM 300, although other definitions of S may be employed. Generally, the total number of address CAM entries between the CAM modules 302 and 304 (i.e., D+S) will not exceed two times the total number of devices that can be addressed through the multi-level CAM 300, although other configurations are contemplated (e.g., D+S can grow larger with features such as Fibre Channel Inter-Fabric Routing). In one implementation, one or more of the address CAM modules comprise TCAMs, although binary CAM implementations and other search implementations are also contemplated. It also should be understood that multiple CAM devices may be employed in a single level of the multi-level CAM 300, and even in a single CAM module, such as CAM module 302 and/or CAM module 304.

Each address CAM module outputs one or more bit vectors representing zero or more match locations resulting from an input search key. Within an address CAM module, a priority encoder and equivalence class memory combine to translate one or more bit vectors into an equivalence class identifier, represented by a search result reference (e.g., an address or pointer), $P_D$ or $P_S$ into a flow zoning matrix implemented in part by the flow CAM 306. The flow zoning matrix relates combinations of destination and source pointers to individual destination port numbers, although generically, the flow CAM 306 can output an address representing any arbitrary value. The flow CAM entries can also be conserved and compressed by swapping columns and rows to make larger cubes and then collapsing multiple rows into a single row associated with a range of source pointers and/or collapsing multiple columns into a single column associated with a range of destination pointers (similar to Karnaugh map (i.e., K-map) minimization). In another implementation, the flow CAM 306 can output Protocol Conversion Table (PCT) indices and multicast information, where a PCT index represents a pointer into separate storage. The PCT index indicates the fundamental changes to be made to a data frame (before it leaves the switch) in order to convert to a specified protocol. Primarily, protocol conversion can be used to perform layer 3 routing, as opposed to the layer 2 switching, where the extra level of networking abstraction can require some changes to the data frame (e.g., removing a header, changing the value of an address field, etc.) Another use of protocol conversion may involve changing layer 2 protocols between ports (e.g., moving an Ethernet packet out of a Fibre Channel port).

FIG. 4 illustrates an exemplary flow zoning matrix 400. The horizontal axis relates to destination search result references and the vertical axis relates to source search result references. The entries in a flow CAM have been configured to form "cubes" within the matrix 400, so as to allow compression using K-map minimization or other compression techniques. In one implementation, the variable M represents the number of possible source or destination search result references supported by the flow CAM. For example, if the source and destination search result references are 16-bit values, then M would equal 64K. It should be understood that the source and destination search result references may be of different lengths, resulting in a matrix having a different width than depth (e.g., L×M).

In the illustrated implementation, matrix 400 includes search result references associated with destination search keys along columns and search result references associated with source search keys along rows. Each cell of the matrix represents a port number (e.g., A and B are distinct port numbers in the illustration). In an alternative implementation, cells of the matrix can reference Virtual Output Queues (VOQs), which can be mapped in combinations to individual physical output ports. In yet another alternative implementation, cells of the matrix can reference Virtual Input Queues (VIQs), which can be mapped in combinations to individual physical input ports.

As shown in FIG. 4, the matrix 400 shows that port A is referenced in cells 402 and 404. Accordingly, some compression may be achieved by swapping rows M-2 and M-1 and then compressing rows M-3 and the new M-2 (using an equivalence relation) into a single row referenced by an equivalence class identifier (e.g., a search result reference output by the first level CAMs). It should be understood that such operations may be applied to both rows and columns and are dependent on the data stored in other cells in the affected rows and columns. Nevertheless, many equivalence relations may be identified and applied in the matrix 400 to compress the data into a set of equivalence classes.

In one implementation, a single entry acts as boundary specification of one, two or three cubes, in terms of coordinate pairs in the flow zoning matrix. Depending on whether the entry is in the horizontal or vertical flow CAM, the cube opens either horizontally or vertically from the given coordinate pair until another flow CAM entry's coordinate pair closes the cube and optionally opens a new cube itself. A case of a single entry specifying the boundary of three cubes is provided by the masking capabilities of each flow CAM entry: since each flow CAM entry can permit power-of-two bit masking, a full cube may be specified by the flow CAM entry (beginning and ending on power-of-2 alignments), while a distinctly different cube may also be opened (to be closed by another entry).

For example, a single vertical flow CAM entry may utilize its bitmask capability to stipulate that classes (0,0) through (0,3) form one cube that maps to the same output port, while entry (0,4) is the coordinate pair that begins the next adjacent cube, extending vertically and mapping to a different output port. Flow CAM minimization, therefore, can involve manipulations to form adjacency among output port targets.

In one implementation, address CAMs group addresses into equivalence classes according to which sources can communicate with common destinations (e.g., source address CAM) and which destinations can communicate with common sources (e.g., destination address CAM), in a manner that minimizes the number of address CAM entries. An exemplary grouping scheme considers equivalence relations based on mutual membership in one or more network zones, although more intricate relations can be established to improve compression. The number of address CAM entries can be further minimized if TCAM devices are employed. With TCAM masking and priority detection features, the input node addresses may be specified in a manner that maximizes masking opportunities, including use of longest-prefix and general nested sub-range matching.

Equivalence class numbers themselves are chosen to optimize adjacency in the flow zoning matrix (e.g., by common output port or VOQ number), although gaps may be left to accommodate possible growth and changes in the topology. Given high adjacency in the flow zoning matrix and a minimal number of equivalence classes, flow CAM cubes can be formed to maximize the output-port-to-flow-CAM-entry expense ratio. As such, the flow CAM cubes can result in the fewest flow CAM entries for the mappings that may be represented. It should be understood, also, that the address CAM entries and equivalence classes can be periodically reconfigured to re-optimize the compression after zoning and topology changes.

FIG. 5 illustrates an exemplary configuration of a switch having a multi-level CAM 500. Data frames are received at ports 502 and communicated through the front MAC 504 to the forwarding logic 506. The forwarding logic 506 extracts data from the data frame (e.g., from the data frame header), from which it forms one or more search keys. The search keys are input to an address CAM that includes one or more CAM devices, each CAM device being coupled to receive and search on search keys from the forwarding logic 506. In one implementation, the address CAM includes twenty-four TCAM devices, although other search devices and configurations may be employed. In one implementation, the TCAM devices 508, 510, 512, and 514, priority encoders 518, and RAM 519 may be considered a CAM module for a first level of the multi-level CAM.

The forwarding logic 506 is configured to direct individual search keys for individual ports in specific combinations to the address CAM devices. For example, the forwarding logic 508 can construct a destination search key that includes the Fibre Channel destination address (DID) (and potentially other fields) of a data frame received at a port X. The forwarding logic 508 sends the destination search key to TCAMs 508, 510, and 514. In contrast, the forwarding logic 508 can construct a source search key to include the Fibre Channel source address (SID) of the same data frame and send the source search key to TCAMs 512 and 514. Furthermore, a destination search key associated with a data frame received at a port Y may be sent to TCAMs 508 and 512. Search keys for individual data frames can be steered to individual TCAMs using a settable bitmask provided at each input port, where each bit of the port's bitmask represents the use of a corresponding TCAM by packets ingressing that port. In one implementation, a binary '1' in the bitmask is used to send destination search keys from a given port to a corresponding TCAM; whereas a binary '0' in the bitmask is used to send source search keys from a given port to a corresponding TCAM.

Each TCAM will search for the received search key and forward the search results, in the form of bit vectors, to priority encoders 518. In one implementation, resulting bit vectors from destination search key searches and source search key searches are directed to separate priority encoders, although a single priority encoder may be employed (e.g., using a multiplexer). Each bit vector resulting from a TCAM identifies the TCAM location(s) satisfying the search key, if any.

The search results are received by a priority encoder 518, which selects a priority bit across all the bit vectors based on one or more rules and then encodes the priority bit into a memory address. For example, in one implementation, the highest numbered bit (across all received bit vectors) is selected and encoded into a memory address, which is output from the priority encoder 518. Alternative rules may be employed, such as "the lowest numbered bit (across all received bit vectors) has priority" and other selection criteria.

The address output by the priority encoder 518 is an address into the RAM 519, which outputs a search result reference value stored at the provided address. This value represents an equivalence class identifier (e.g., $C_S$ for the source equivalence class and $C_D$ for the destination equivalence class) in the flow zoning matrix partially defined in the flow CAM 520. An equivalence class represents a subset of given set induced by an equivalence relation on that given set. Elements of an equivalence class are said to be equivalent under the equivalence relation to all the other elements of the same equivalence class. Equivalence classes and their corresponding equivalence relations are generally defined in the mathematical field of set theory. As such, an equivalence class identifier associates one or more TCAM entries for look-up in the flow CAM 250.

For an example of the application of equivalence classes, using a technique similar to K-map minimization, two different search result bits from a source search key search in the first CAM level may be considered equivalent. Therefore, the priority encoder 518 and RAM 519 may combine to provide an equivalence class identifier common to both of the search result bits. As such, the different search result bits would yield an equivalence class identifier that designates the same row in the flow zoning matrix defined by the flow CAM 520.

The equivalence class identifiers from the RAM 519 are input to the flow CAM 520, which defines the flow zoning matrix. Given the equivalence class identifiers from both the source and destination searches, the flow CAM 520 can determine and output the port number to which the data frame should be forwarded. In an alternative implementation, the flow CAM 520 can output multicast information and a PCT index into separate storage (not shown). Other flow CAM outputs are also contemplated. The flow CAM output is sent to the decision module 522, which determines whether the port number is on the current device (and therefore that the data frame should be forwarded to that port of the front MAC 504) or whether the data frame should be forwarded out an extender port 526 of a back MAC 524 to another port module.

FIG. 6 illustrates exemplary operations 600 for processing a data frame using a multi-level CAM. A data frame is received by a switch and directed through a MAC to the forwarding logic in receiving operation 602. A parsing operation 604 extracts information (e.g., from the data frame header) to form a source search key and a destination search key. For example, the SID may be used to form the source search key and the DID may be used to form the destination search key. Other data fields may be used to form search keys, including VF_ID ("Fibre Channel Virtual Address"), VID ("Ethernet Virtual LAN ID"), IPv4 DA ("destination IP address"), IPv4 SA ("source IP address"), ingress port number, SOF values, IPv6 source and destination addresses, routing parameters, etc.

In searching operation 606, each search key is input to a first level CAM. In one implementation, the first level CAM is configured from a selection of individual CAM devices. Depending on which port the data frame is received through and whether the search key is based on a destination search key or a source search key, the search key is directed to a selected set of these individual CAM devices. The first level CAM devices may be TCAMs, binary CAMs, or other CAM or search structures, such as a RAM-based search tree.

The searching operation 606 results in one or more bit vectors representing search results on the associated search keys, which are input to a priority encoder. The bit vectors of each search type (e.g., source search and destination search) are concatenated into an aggregate bit vector and input to the priority encoder. In one implementation, the search results relating to a destination search key are directed to a first priority encoder and the search results relating to a source search key are directed to a second priority encoder, although other configurations may be employed.

In an encoding operation 608, each priority encoder applies a priority rule that selects a priority bit from the search result bit vectors and encodes the priority bit into an address in an equivalence class memory. In one implementation, the priority rule selects the highest number bit representing a search "hit", although alternative rules may be employed (e.g., the lowest number bit or some other more complex algorithm). The priority encoder then encodes the priority bit into an address in an equivalence class memory to yield an equivalence class identifier corresponding to the priority bit. A memory operation 610 determines the equivalence class from the equivalence class memory by outputting the equivalence class identifier that resides at the priority memory address in the equivalence class memory. Similar operations (e.g., 606, 608, and 610) are performed on the search results of each search type to yield individual equivalence class identifiers for each search type.

The individual equivalence class identifiers are input to a second level CAM in a determination operation 612. The second level CAM operates as a flow CAM implementing a flow zoning matrix, which associates the equivalence classes to a flow CAM search result. In one implementation, a flow CAM search result may represent a port number to which a given data frame should be forwarded. Alternatively, a flow CAM search result may represent other data, including a PCT index, multicast information, Ethernet packet parameters, protocol conversion information, inter-fabric routing information, diagnostic information for monitoring specific flows, etc. In the illustrated process, a forwarding operation 614 directs the data frame to the port identified by the resulting port number.

FIG. 7 illustrates an alternative implementation of an exemplary multi-level CAM 700, including three parallel CAMs 702, 704, and 706. Each of the parallel CAMs receives the same input data 708. A priority multiplexer 710 selects and encodes the outputs of the parallel CAMs and can output the output port number, multicast information, PCT index, etc.

The illustrated configuration demonstrates that a structurally hierarchical CAM set may be altered to provide flat CAM functionality. A topology having mainly distinct one-to-one SID-to-DID associations does not benefit as much from the compression provided by other configurations. As such, this configuration provides better utilization of the available CAM storage by flattening the hierarchical CAM structure and using each entry for a distinct SID-to-DID flow. Alternatively, this configuration would be beneficial in an application in which SID-based observations are not required (e.g., no hard zoning, no source-based load balancing, etc.). In any case, utilization of existing CAM storage space can be more efficient with the illustrated configuration, although the total address space serviced by the illustrated CAM configuration may be smaller than in a hierarchical CAM configuration.

FIG. 8 illustrates another alternative implementation of an exemplary multi-level CAM 800, including two address CAMs 802 and 804 and a composite CAM 806. The composite CAM 806 includes both direct CAM entries 808 and flow CAM entries 810. The address CAMs 802 and 804 operate as described with regard to FIG. 2. If either address CAM misses (i.e., does not match the search key), the direct CAM entries 808 in the composite CAM 806 are searched using a search key formed from both the source search key data and the destination search key data. Otherwise, the source and destination search result references are used to search the flow CAM entries, as described with regard to FIG. 2. Such a configuration may be described as "predicated direct CAM lookup".

FIG. 9 illustrates yet another alternative implementation of an exemplary multi-level CAM, including two address CAMs 902 and 904 and two flow CAMs 906 and 908, one representing the vertical axis of the flow zoning matrix (e.g., source) and the other representing the horizontal axis of the flow zoning matrix (e.g., destination). The address CAMs 902 and 904 operate as described with regard to FIG. 2, outputting search result references into the flow zoning matrix 912.

The flow CAMs 906 and 908 provide independent source and destination searches, where CAM entries can reference cubes in respective orientations (e.g., vertical and horizontal). For example, vertical flow CAM entries form cubes to cover the matrix vertically (see e.g., cubes 914 and 916), and horizontal flow CAM entries form cubes to cover the matrix horizontally (see e.g., cube 918). As a result, full rectangular cubing is available to flow CAM searching so that entire rectangular blocks of contiguous matrix elements may be covered without restricting cubes in other directions. "Rectangular cubing" generally refers to the formation of cubes that cover multiple rows and columns (i.e., that extend both vertically and horizontally). Performing rectangular cubing in a RAM-based binary search tree flow CAM can be implemented using a mask bit in each of the source search result reference $P_S$ and the destination search result reference $P_D$.

It should be understood that predicated direct CAM lookup may be combined with this and any other multi-level CAM configuration. Further, more than two CAM levels may be employed in various multi-level CAM configuration using the principles described herein. FIG. 10 illustrates an example multi-level CAM configuration 1000 with more than two CAM levels. The CAM configuration 1000, as with all of the described configurations, may have general applicability, and is not limited to SAN applications.

In FIG. 10, the function F represents a CAM function for an individual CAM device. The variable p represents the number of CAM devices in the top row of the multi-level CAM configuration 1000. The variable L represents the number of levels in the multi-level CAM configuration 1000.

The embodiments of the invention described herein can be implemented as logical steps in one or more computer systems. The logical operations of the present invention can be implemented (1) as a sequence of processor-implemented steps executing in one or more computer systems and (2) as interconnected machine or circuit modules within one or more computer systems. The implementation is a matter of choice, dependent on the performance requirements of the computer system implementing the invention. Accordingly, the logical operations making up the embodiments of the invention described herein are referred to variously as operations, steps, objects, or modules. Furthermore, it should be understood that logical operations may be performed in any order, unless explicitly claimed otherwise or a specific order is inherently necessitated by the claim language.

The above specification, examples and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A multi-level content addressable memory comprising:
   a first content addressable memory module that receives a search key of a first search type and outputs a first search result reference;

a second content addressable memory module that receives a search key of a second search type and outputs a second search result reference; and an output content addressable memory coupled to receive the first search result reference from the first content addressable memory module and the second search result reference from the second content addressable memory module, wherein the output content addressable memory outputs an output search result based on the first search result reference and the second search result reference.

2. The multi-level content addressable memory of claim 1 wherein the first content addressable memory module comprises:

a content addressable memory device that receives the search key of the first search type and outputs a search result based on the search key of the first search type; and a priority encoder that receives the search result from the content addressable memory device and encodes the search result into an address of an equivalence class memory.

3. The multi-level content addressable memory of claim 1 wherein the first content addressable memory module comprises:

a content addressable memory device that receives the search key of the first search type and outputs a search result based on the search key of the first search type;

an equivalence class memory storing equivalence class identifiers; and a priority encoder that receives the search result from the content addressable memory device and encodes the search result into an address to an equivalence class identifier stored in the equivalence class memory, wherein the equivalence class identifier represents the first search result reference.

4. The multi-level content addressable memory of claim 1 wherein the first search result reference identifies an equivalence class.

5. The multi-level content addressable memory of claim 1 wherein the output content addressable memory module comprises a RAM-based binary search tree.

6. The multi-level content addressable memory of claim 1 wherein the multi-level content addressable memory implements a forwarding database in a network communications device, and further the first search type represents a search on a source search key formed from a source address associated with a received data frame and the second search type represents a search on a destination search key formed from a destination address associated with the received data frame.

7. The multi-level content addressable memory of claim 1 wherein the output search result of the output content addressable memory represents a port number of a network communications device.

8. The multi-level content addressable memory of claim 1 wherein the output search result of the output content addressable memory represents a virtual input queue reference of a network communications device.

9. The multi-level content addressable memory of claim 1 wherein the output search result of the output content addressable memory represents a virtual output queue reference of a network communications device.

10. A method for processing data using a multi-level content addressable memory comprising:

receiving a search key of a first search type in a first content addressable memory module;

outputting a first search result reference from the first content addressable memory module, based on the search key of the first search type;

receiving a search key of a second search type in a second content addressable memory module;

outputting a second search result-reference from the second content addressable memory module, based on the search key of the second search type;

outputting an output search result from output content addressable memory based on the first search result reference and the second search result reference, wherein the output content addressable memory is coupled to receive the first search result reference from the first content addressable memory module and the second search result reference from the second content addressable memory module.

11. The method of claim 10 wherein the operation of receiving a search key of a first search type in a first content addressable memory module comprises:

receiving the search key into a content addressable memory device;

outputting a search result from the content addressable memory device based on the search key of the first search type;

selecting a priority bit from the search result; and encoding the priority bit into an address of an equivalence class memory as the first search result reference.

12. The method of claim 10 wherein the operation of receiving a search key of a first search type in a first content addressable memory module comprises:

receiving the search key of the first search type into a content addressable memory device;

outputting a search result from the content addressable memory based on the search key of the first search type;

selecting a priority bit from the search result;

encoding the priority bit into an address of an equivalence class memory; and outputting an equivalence class identifier from the equivalence class memory as the first search result reference.

13. The method of claim 10 wherein the first search result reference identifies an equivalence class.

14. The method of claim 10 wherein the output content addressable memory module comprises a RAM-based binary search tree.

15. The method of claim 10 wherein the multi-level content addressable memory implements a forwarding database in a network communications device, and further the first search type represents a search on a source search key formed from a source address associated with a received data frame and the second search type represents a search on a destination search key formed from a destination address associated with the received data frame.

16. The method of claim 10 wherein the output search result of the output content addressable memory represents a port number of a network communications device.

17. The method of claim 10 wherein the output search result of the output content addressable memory represents a virtual input queue reference of a network communications device.

18. The method of claim 10 wherein the output search result of the output content addressable memory represents a virtual output queue reference of a network communications device.

19. A network communications device comprising:
a multi-level content addressable memory including
- a first content addressable memory module that receives a search key of a first search type and outputs a first search result reference;
- a second content addressable memory module that receives a search key of a second search type and outputs a second search result reference; and
- an output content addressable memory coupled to receive the first search result reference from the first content addressable memory module and the second search result reference from the second content addressable memory module, wherein the output content addressable memory outputs an output search result based on the first search result reference and the second search result reference.

20. The network communications device of claim 19 wherein the multi-level content addressable memory implements a forwarding database in the network communications device, and further the first search type represents a search on a source search key formed from a source address associated with a received data frame and the second search type represents a search on a destination search key formed from a destination address associated with the received data frame.

* * * * *

UNITED STATES PATENT AND TRADEMARK OFFICE
CERTIFICATE OF CORRECTION

PATENT NO. : 7,606,968 B2
APPLICATION NO. : 11/430389
DATED : October 20, 2009
INVENTOR(S) : Branscome et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 416 days.

Signed and Sealed this

Twelfth Day of October, 2010

David J. Kappos
*Director of the United States Patent and Trademark Office*